US010103817B2

(12) United States Patent
Polster et al.

(10) Patent No.: US 10,103,817 B2
(45) Date of Patent: Oct. 16, 2018

(54) OPTICAL DATA RECEIVER WITH RELATIVE PHASE DETECTOR

(71) Applicant: Commissariat à l'Énergie Atomique et aux Énergies Alternatives, Paris (FR)

(72) Inventors: Robert Polster, Berlin (DE); Ivan Miro Panades, Grenoble (FR); Yvain Thonnart, Grenoble (FR)

(73) Assignee: Commissariat à L'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/381,405

(22) Filed: Dec. 16, 2016

(65) Prior Publication Data

US 2017/0180056 A1 Jun. 22, 2017

(30) Foreign Application Priority Data

Dec. 18, 2015 (FR) .................................... 15 62863

(51) Int. Cl.
*H04B 10/69* (2013.01)
*H04B 10/07* (2013.01)
*H04B 10/66* (2013.01)

(52) U.S. Cl.
CPC ......... *H04B 10/6911* (2013.01); *H04B 10/07* (2013.01); *H04B 10/66* (2013.01)

(58) Field of Classification Search
CPC .................................................. H04B 10/695
See application file for complete search history.

(56) References Cited

U.S. PATENT DOCUMENTS

| | | | | |
|---|---|---|---|---|
| 5,754,606 | A | 5/1998 | Matsuyama et al. | |
| 9,300,461 | B2 * | 3/2016 | Akita | H03L 7/087 |
| 2004/0062336 | A1 * | 4/2004 | Kuwata | H03L 7/081 375/376 |
| 2014/0064744 | A1 | 3/2014 | Yoshiyama et al. | |
| 2015/0326384 | A1 | 11/2015 | Wu | |
| 2016/0099782 | A1 * | 4/2016 | Kuang | H04B 10/25133 398/136 |

OTHER PUBLICATIONS

"Latches, the D Flip Flop & Counter Design", ECE 152 A, Winter 2012.*
French Search Report for Application No. FR 1562863 dated Aug. 31, 2016.

* cited by examiner

*Primary Examiner* — Shi K Li
(74) *Attorney, Agent, or Firm* — Wolf, Greenfield & Sacks, P.C.

(57) ABSTRACT

An optical receiver adapted to convert a received optical signal into a phase change of a timing signal to generate a first modified timing signal and to generate a data signal by comparing the first modified timing signal with a reference signal.

15 Claims, 3 Drawing Sheets

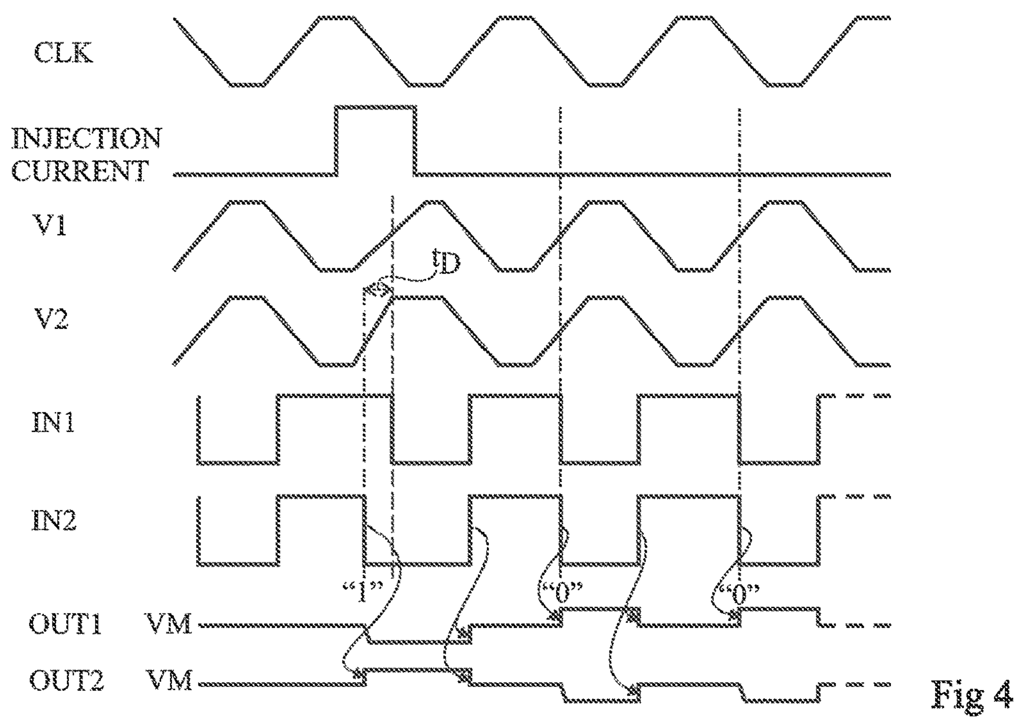
Fig 4
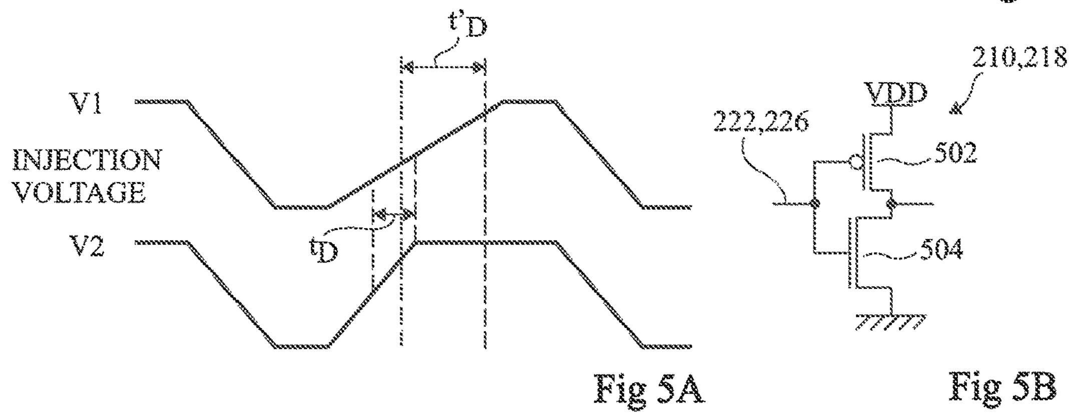
Fig 5A
Fig 5B
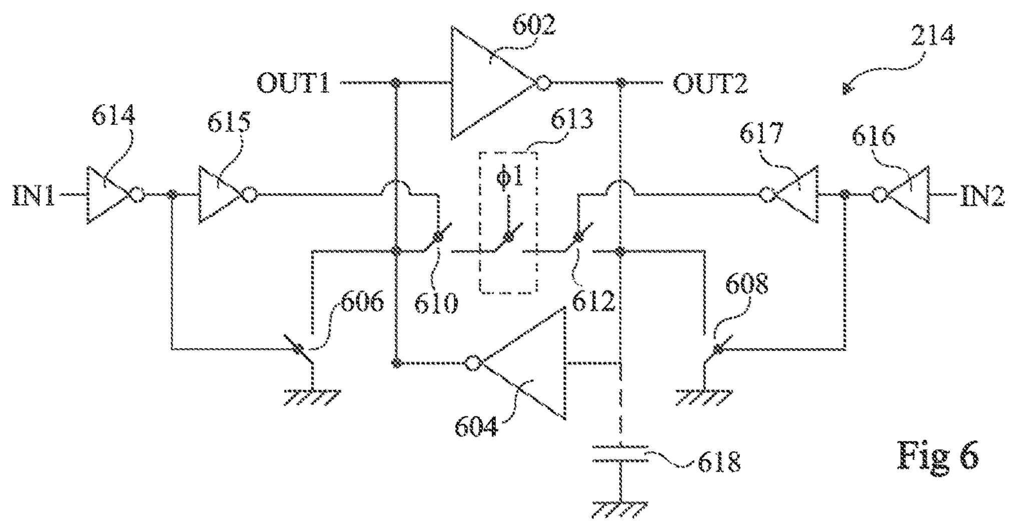
Fig 6

OPTICAL DATA RECEIVER WITH RELATIVE PHASE DETECTOR

CROSS-REFERENCE TO RELATED APPLICATION

This application claims priority to French patent application number 15/62863, filed Dec. 18, 2015, which is hereby incorporated by reference in its entirety to the maximum extent allowable by law.

FIELD

The present disclosure relates to the field of optical data receivers, and in particular to an optical data receiver capable of receiving a low amplitude optical signal.

BACKGROUND

Optical links provide high data transmission rates at low power, and thus present a viable solution for replacing ordinary copper interconnects between integrated circuits. Optical reception is based on capturing, using a photosensitive device such as a photodiode, a light signal that is generally encoded in a digital fashion, and which may have a power level as low as 10 μW. The photosensitive device for example generates a small current that is transformed by the optical receiver into a digital voltage signal.

A difficulty in optical data reception is to be able to accurately detect the low power optical signal. Indeed, the current generated by the data pulse of the optical signal may be as low as 10 μA.

There is thus a need in the art for an optical receiver having high sensitivity while maintaining low complexity and low power consumption.

SUMMARY

It is an aim of embodiments of the present description to at least partially address one or more problems in the prior art.

According to one aspect, there is provided an optical receiver adapted to convert a received optical signal into a phase change of a timing signal to generate a first modified timing signal and to generate a data signal by comparing the first modified timing signal with a reference signal.

According to one embodiment, the received optical signal is a signal modulated based on data to be transmitted to the optical receiver.

According to one embodiment, the optical receiver comprises: an input adapted to receive the timing signal having rising and falling edges; a first branch coupled to the input and comprising at least one logic gate adapted to propagate the timing signal and to generate the first modified timing signal; a second branch coupled to the input and comprising at least one logic gate adapted to propagate the timing signal and to generate a second modified timing signal forming said reference signal; a photodiode adapted to convert the received optical signal into a current signal, the photodiode being coupled to at least one of the first and second branches to induce, based on the current signal, a phase difference between rising or falling edges of the first and second modified timing signals; and a relative phase detector adapted generate the data signal by detecting the relative phases of rising or falling edges of the first and second modified timing signals.

According to one embodiment, the photodiode is coupled so that the current signal causes a change in the slope of a first rising or falling edge of the timing signal propagating through at least one of the first and second branches, at least one of the first and second branches comprising a comparator adapted to convert the change of slope into a phase shift of the first rising or falling edge.

According to one embodiment, the rising or falling edge is a voltage transition between first and second voltage levels, and wherein the comparator is a transistor device adapted to generate a voltage transition at its output when the voltage at its input crosses a threshold level, and the comparator is adapted such that the threshold level is at least 10 percent higher or lower than a mid-point between the first and second voltage levels.

According to one embodiment, the first branch comprises a first logic gate connected to the input and the photodiode is coupled to an output of the first logic gate.

According to one embodiment, the second branch comprises a second logic gate connected to the input, and wherein the photodiode is coupled between the output of the first logic gate and an output of the second logic gate.

According to one embodiment, the first branch comprises a second logic gate having an input node coupled to the input and having a first supply voltage input node coupled to a first supply voltage rail via a first current source, and the photodiode is coupled to the first supply voltage input node.

According to one embodiment, the second branch comprises a second logic gate having an input node coupled to the input and having a first supply voltage input node coupled to the first supply voltage rail via a second current source, wherein the photodiode is coupled between the first supply voltage input nodes of the second logic gates of the first and second branches.

According to one embodiment, the photodiode is coupled between the first and second branches.

According to one embodiment, the relative phase detector is adapted to detect the relative phases of rising edges of the first and second modified timing signals, the optical receiver further comprising: a third branch coupled to the input and comprising at least one logic gate adapted to propagate the timing signal and generate a third modified timing signal; a fourth branch coupled to the input and comprising at least one logic gate adapted to propagate the timing signal and generate a fourth modified timing signal; and a further relative phase detector adapted to generate a further data signal by detecting the relative phases of falling edges of the third and fourth modified timing signals.

According to one embodiment, the photodiode is coupled so that the current signal causes a change in the slope of a first rising edge of the timing signal propagating through at least one of the first and second branches, and of a first falling edge of the timing signal propagating through at least one of the third and fourth branches, the first and second branches each comprise a first comparator adapted to generate a voltage transition at its output when the voltage at its input crosses a threshold level, the first comparators are adapted such that the threshold level is at least 10 percent higher than a mid-point between the first and second voltage levels, and the third and fourth branches each comprise a second comparator adapted to generate a voltage transition at its output when the voltage at its input crosses a threshold level, the second comparators being adapted such that the threshold level is at least 10 percent lower than a mid-point between the first and second voltage levels.

According to one embodiment, the first and second comparators are formed by inverters.

According to one embodiment, the relative phase detector comprises an early-late detector comprising: a bi-stable storage device formed of a pair of inverters cross-coupled between first and second output nodes of the early-late detector; at least one first switch coupled between the first and second output nodes and controlled based on the first and second modified timing signals; a second switch controlled based on the first modified timing signal and coupled between the first node and a first supply voltage rail; and a third switch controlled based on the second modified timing signal and coupled between the second node and the first supply voltage rail.

According to one embodiment, the at least one first switch comprises a pair of first switches coupled in series between the first and second output nodes, a first switch of the pair being controlled based on the first modified timing signal, and a second switch of the pair being controlled based on the second modified timing signal.

According to one embodiment, the at least one first switch further comprises a further switch coupled between the switches of the pair of first switches and controlled by an activation signal to selectively activate the relative phase detector.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 4 is a timing diagram illustrating an example of signals in the receiver of FIGS. 2 and 3 according to an example embodiment of the present disclosure;

FIG. 5A is a timing diagram illustrating examples of signals in the receiver of FIGS. 2 and 3 according to a further example embodiment of the present disclosure;

FIG. 5B schematically illustrates a logic gate of the optical receiver of FIGS. 2 and 3 according to an example embodiment of the present disclosure;

FIG. 6 schematically illustrates an early-late detector of the optical receiver of FIGS. 2 and 3 in more detail according to an example embodiment of the present disclosure.

DETAILED DESCRIPTION

Throughout the present description, the term "connected" is used to designate a direct electrical connection between elements, whereas the term "coupled" is used to designate an electrical connection between elements that may be direct, or may be via one or more other components such as resistors, capacitors or transistors. Furthermore, as used herein, the term "substantially" is used to designate a range of +/− 10 percent of the value in question.

Figure 1:
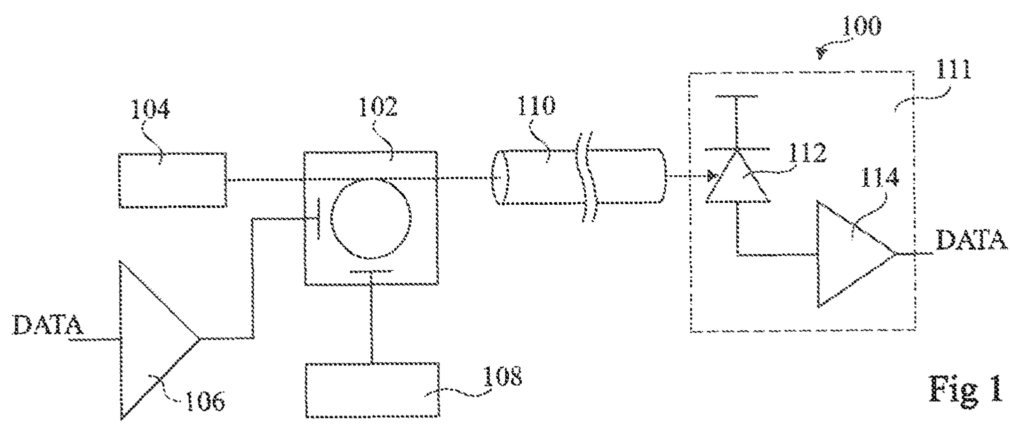
FIG. 1 schematically illustrates an optical link according to an example embodiment.

FIG. 1 schematically illustrates an optical link 100. As illustrated, on a transmission side, a modulator 102 modulates a laser beam generated by a laser 104 based on a signal provided by a driver 106. In some embodiments, the modulator 102 is also controlled by a signal from a temperature control circuit 108. The driver 106 receives a data signal DATA to be transmitted. The modulator 102 generates an optical signal, which is transmitted via a waveguide 110 to the reception side of the optical link. On the reception side, the optical signal is received by an optical receiver 111 formed of a photodiode 112 and a data detection circuit 114. The photodiode 112 converts the optical signal into an electrical current. The data detection circuit 114 detects the data signal based on the current generated by the photodiode 112.

Figure 2:
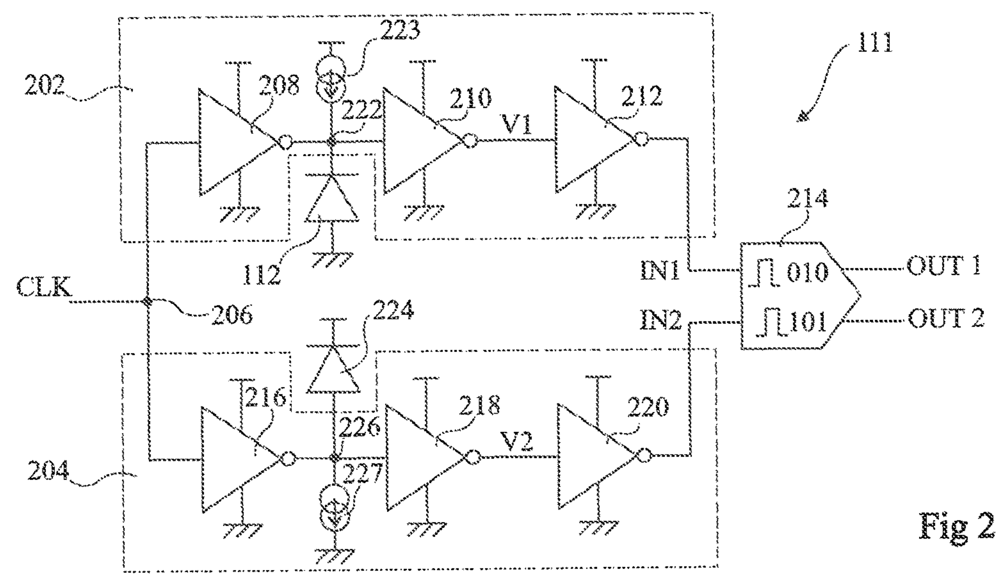
FIG. 2 schematically illustrates an optical receiver for receiving an optical data signal according to an example embodiment of the present disclosure.

FIG. 2 illustrates the optical receiver 111 in more detail according to an example embodiment. The optical receiver 111 for example comprises a branch 202 and a branch 204, each branch being coupled to an input line 206 for receiving a clock signal CLK. Each of the branches 202, 204 for example comprises a plurality of logic gates coupled in series. In the example of FIG. 2, the logic gates are inverters, although in alternative embodiments other types of logic gate could be used. The branch 202 for example comprises a series connection of inverters 208, 210 and 212 coupled between the input line 206 and one input of a relative phase detector 214. The branch 204 for example comprises a series connection of inverters 216, 218 and 220 coupled between the input line 206 and another input of the relative phase detector 214. However, in alternative embodiment each branch 202, 204 coupled comprise only one logic gate, or a different number of logic gates.

The clock signal CLK for example comprises voltage transitions between low and high voltage levels. Each of these rising and falling edges has a certain slope depending on various physical characteristics of the circuit elements, such as the input capacitances of the inverters forming each branch, the voltage levels, etc. The photodiode 112 is for example coupled to one or both of the branches 202 or 204 so that, based on the optical signal, the slope of rising and/or falling edges propagating through one branch is modified with respect to the other branch.

The relative phase detector 214 for example detects the relative phases of rising or falling edges of the modified timing signal IN1 at the output of the branch 202 and the modified timing signal IN2 at the output of the branch 204, and generates the corresponding data output signal accordingly. By "relative phase", this means the time order in which the edges occur. In one embodiment, the relative phase detector 214 is an early-late relative phase detector that generates output signals OUT1, OUT2, as will be described in more detail below.

In the example of FIG. 2, the photodiode 112 has its cathode coupled to a node 222 at the output of the inverter 208, and its anode coupled to a supply voltage VDD. Thus, when an optical pulse is received by the photodiode 112, a current will be generated by the photodiode 112 thereby discharging the input capacitance of the inverter 210. If this optical pulse arrives during a rising clock edge of the clock signal CLK at the inverter 210, it will tend to decrease the gradient of the slope of the rising clock edge, whereas if this optical pulse arrives during a falling clock edge of the clock signal CLK at the inverter 210, it will tend to increase the gradient of the slope of the falling clock edge. As described in more detail below, the clock signal CLK is for example synchronised with the optical data signal such that pulses of the data signal occur during rising and/or falling edges of the clock signal. In some embodiments, in the absence of an optical signal, the photodiode 112 conducts a constant current, which will be referred to herein as a dark-current, and a current source 223 is for example coupled between the node 222 and the supply voltage to cancel this dark-current and/or to provide calibration.

In some embodiments, a further photodiode 224 is coupled in the branch 204, for example between a node 226 at the output of the inverter 216 and the supply voltage. The received optical signal is for example provided to both of the photodiodes 112 and 224, and they induce opposite effects in the branches 202, 204, thereby accentuating the phase difference between the branches. As with the photodiode 112, the photodiode 224 may conduct a background current that can be cancelled by a current source 227 coupled between the node 226 and ground.

Alternatively, the photodiode 224 could be a dummy photodiode, which does not receive the optical signal. In such a case, rather than being coupled in an opposite manner to the photodiode 112, it is for example coupled in the same way, for example between the node 226 and ground, such that the branches 202, 204 are identical except for the presence of the optical signal at the photodiode 112.

Furthermore, in alternative embodiments, the photodiode 112 could be coupled to a different point along the branch 202 and/or 204. The point along the branch 202 and/or 204 at which the photodiode is connected is for example isolated from the input line 206 by at least one logic gate, such that it does not influence the signal propagating through both branches 202, 204 in the same way. In some embodiments, there is at least one logic gate in each branch 202, 204 after the point at which the photodiode 112 is connected, these logic gates transform the edge having a change in gradient to an edge having a relatively steep gradient and a phase shift.

Figure 3:
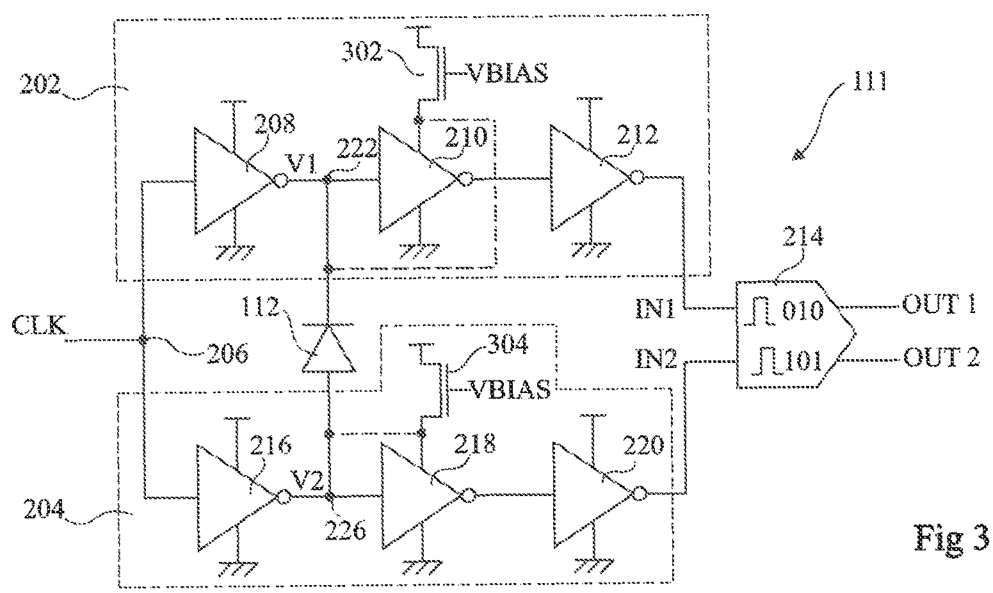
FIG. 3 schematically illustrates an optical receiver for receiving an optical data signal according to a further example embodiment of the present disclosure.

FIG. 3 illustrates the optical receiver 111 according to an alternative embodiment similar to that of FIG. 2, and like features have been labelled with like reference numerals and will not be described again in detail. In the embodiment of FIG. 3, the photodiode 112 for example has its cathode coupled to the node 222 at the output of the inverter 208 of the branch 202, and its anode coupled to the node 226 at the output of the inverter 216 of the branch 204. In this way, an optical pulse arriving at the photodiode 112 will charge the input capacitance of the inverter 218 and discharge the input capacitance of the inverter 210. While not shown in FIG. 3, in some embodiments the current sources 223 and 227 of FIG. 2 could also be provided in the circuit of FIG. 3 coupled respectively to the nodes 222 and 226.

Alternatively, rather than being coupled between the nodes 222 and 226, the photodiode 114 could be coupled between supply lines of the inverters 210, 218, as represented by dashed lines in FIG. 3. For example, a transistor 302 is coupled by its main conduction nodes between the positive supply rail VDD and the positive supply input node of the inverter 210. Similarly, a transistor 304 is for example coupled by its main conduction nodes between the positive supply rail VDD and the positive supply input node of the inverter 218. The transistors 302, 304 are for example controlled by a biasing voltage $V_{BIAS}$ such that they behave as current sources, the current generated by each of these current sources being a function of the dimensions of the respective transistor 302, 304 and the level of the biasing voltage $V_{BIAS}$. The photodiode 112 is for example coupled between the positive supply input nodes of the inverters 210 and 218, such that an optical pulse arriving at the photodiode 112 will reduce the supply voltage to the inverter 210 and increase the supply voltage to the inverter 218, thereby altering the gradient of a rising or falling edge propagated by the branches 202 and 204.

FIG. 4 is a timing diagram illustrating an example of the following signals in the optical receiver 111 of FIGS. 2 and 3: the clock signal CLK, a current (INJECTION-CURRENT) injected by the photodiode 112, the voltage signals V1 at the output of the inverter 208 and V2 at the output of the inverter 216, the modified timing signal IN1 at the output of the branch 202, the modified timing signal IN2 at the output of the branch 204, and the output signal OUT1, OUT2 of the relative phase detector 214.

The clock signal CLK is for example a square-wave signal having sloped rising and falling edges. In the absence of an optical pulse, the current injected by the photodiode is for example close to 0 μA, or at a constant level conducted by the current sources 223, 227, and thus the signals V1 and V2 are substantially equal to the inverted form of the clock signal CLK. However, when a current pulse is injected by the photodiode during a falling edge of the clock signal CLK, the slope of the corresponding rising edge of the signals V1 and V2 is altered. In the example of FIG. 4, the gradient of the slope of the rising edge of signal V1 is reduced, whereas the gradient of the slope of the rising edge of the signal V2 is increased, but this will depend on the particular configuration of the photodiode 112. Assuming that the inverters 210, 212 and 218, 220 change their output state when the input signal crosses a threshold level substantially equal to the mid-point between the high and low supply voltages, for example VDD/2, this will result in a time difference $t_D$ shown in FIG. 4 between the time at which this threshold is crossed for the signals V1 and V2. After the signals V1 and V2 have propagated through one or more further inverters in each branch 202, 204, the signals IN1 and IN2 thus have falling edges having a phase difference equal to $t_D$. Indeed, the falling edge of the signal IN1 for example arrives a time $t_D$ after the corresponding edge of the signal IN2.

The relative phase detector 214 for example generates output voltages OUT1 and OUT2, which are each at a metastable level VM until a falling edge of the signal IN1 or IN2 arrives. The metastable level is for example at the midpoint between the high and low supply voltages, which is for example at substantially VDD/2. In response to a falling edge of the signal IN2 arriving before a falling edge of the signal IN1, the signal OUT2 for example goes high, and the signal OUT1 goes low. The metastable states are for example reset during a high pulse of the signals IN1, IN2. In response to a falling edge of the signal IN1 arriving before a falling edge of the signal IN2, the signal OUT1 for example goes high, and the signal OUT2 goes low.

In the absence of an optical signal, the rising and falling edges of the signals IN1, IN2 will occur at substantially the same time. The relative phase detector 214, and/or either or both of the branches 202, 204 is for example biased to favour a given state of the output signals OUT1, OUT1 for such cases. For example, transistor sizes or the supply voltage level of one or more of the logic gates of the branch 204 are selected such that, without an optical signal, the edges of the signal IN2 will occur after the edges of the signal IN1. This is represented in the example of FIG. 4, where "0" data bits are generated by the output signal OUT1 going high when no optical signal is present.

FIG. 5A is a timing diagram illustrating the signals V1 and V2 during the rising edges that occur during the current pulse. As illustrated, in the case the inverters 210 and 218 have threshold voltage levels occurring at substantially the mid-point between the high and low supply voltages, the phase difference induced by the change in slope of the rising edges will be $t_D$ as in the example of FIG. 4. This time difference can be amplified if the logic gates 210 and 218 are adapted to have threshold levels different to VDD/2. For example, FIG. 5A illustrates an example in which the threshold level is increased to substantially 0.9*VDD, and thus the phase difference is now increased to $t_D'$. In the case of falling edges of the signals V1 and V2, the threshold level is for example decreased in order to amplify the phase difference between the branches. For example, the threshold level is increased or decreased to be at least 10 percent, and for example 30 percent or more, higher or lower than the mid-point between the high and low supply voltages. This shift in the threshold level is for example achieved by adapting the transistor sizes of the logic devices 210 and 218, as will now be described with reference to FIG. 5B.

FIG. 5B schematically illustrates the inverters 210, 218 according to an example embodiment. Each inverter 210, 218 is for example implemented by a PMOS transistor 502 and an NMOS transistor 504 coupled in series by their main conducting nodes between the supply voltage VDD and ground. The gates of the transistors 502, 504 are coupled to the node 222 in the case of inverter 210, and to node 226 in the case of inverter 218. The drains of the transistors 502, 504 provide the output node of the inverter 210, 218. The dimensions of the PMOS transistor 502 and NMOS transistor 504 are for example chosen such that the inverter is unbalanced. For example, in a balanced inverter, the width $W_p$ of the PMOS transistor is substantially twice the width $W_n$ of the NMOS transistor. If the width $W_p$ is increased or the width $W_n$ decreased, the trigger voltage at which the inverter switches will rise. This means that a rising edge at the input node 222, 226 of the inverter must reach a relatively high level in order to activate the transistor 504 and bring the output node to a low voltage. Alternatively, if the width $W_p$ is decreased or the width $W_n$ increased, the trigger voltage at which the inverter switches will fall.

Rather than being implemented by unbalanced inverters, the logic devices 210 and 218 could be implemented by comparators receiving appropriate reference voltages to modify the voltage level at which they are triggered.

FIG. 6 illustrates the relative phase detector 214 in more detail according to an example embodiment in which it is implemented by an early-late detector. The early-late detector 214 for example comprises a bi-stable storage circuit formed of a pair of inverters 602 and 604 cross-coupled between output nodes OUT1 and OUT2 of the early-late detector 502.

The output node OUT1 is coupled to ground via a switch 606, and the output node OUT2 is coupled to ground via a switch 608. Furthermore, the output nodes OUT1 and OUT2 are coupled together by the series connection of a pair of switches 610 and 612. In some embodiments, a further switch 613 is also coupled between the switches 610 and 612, and controlled by a phase signal $\phi$1, allowing the early-late detector 214 to be activated or deactivated, as will be described in more detail below. It is assumed that the switches 606, 608, 610 and 612 are rendered conductive by a high level of the applied control signal, and rendered non-conductive by a low level of the applied control signal. For example, the switches are based on NMOS transistors. However, in alternative embodiments the inverse could be true.

The switch 610 is controlled based on the modified timing signal IN1. For example, inverters 614 and 615 are coupled in series between the line providing the modified timing signal IN1 and the control node of the switch 610. Similarly, the switch 612 is controlled based on the modified timing signal IN2. For example, inverters 616 and 617 are coupled in series between the line providing the modified timing signal IN2 and the control node of the switch 612. The switch 606 is for example controlled by the output of the inverter 614, and the switch 608 is for example controlled by the output of the inverter 616. The example of FIG. 6 is based on a detector for detecting a phase difference between falling edges of the signals IN1, IN2, but could be adapted to detect a phase difference between rising edges by removing the inverters 614 and 616.

Optionally, an unbalancing circuit is provided for unbalancing the bi-stable circuit of the early-late detector. In particular, when the modified timing signals IN1 and IN2 are in phase, the unbalancing circuit for example causes the output of the early-late detector 502 to favour one state. For example, the unbalancing circuit comprises a capacitor 618 coupled to the output node OUT2. The capacitances of the capacitor 618 is for example relatively low, for example substantially equal to 1 fF.

In operation, the signal $\phi$1 is for example asserted to activate the early-late detector 214, and initially, both of the modified timing signals IN1, IN2 are high, and thus the outputs OUT1 and OUT2 are coupled together by the switches 610, 612. The voltages at these nodes are thus at the intermediate level VM represented in the timing diagram of FIG. 4. When the modified timing signal IN1 has a falling edge arriving before a falling edge of the modified timing signal IN2, the switch 610 is opened, and the switch 606 is closed, such that the voltage OUT1 is brought towards the ground level. This causes the voltage OUT2 to go to the supply voltage level. The arrival a falling edge of the modified timing signal IN2 can no longer change the state of the bi-stable circuit. When the modified timing signals IN1, IN2 go high, the output voltages OUT1 and OUT2 are reset by the switches 610, 612 to the intermediate level VM.

Thus it can be seen that the series connection of the switches 610 and 612 respectively controlled based on the modified timing signals IN1 and IN2 permits the metastable state of the latch formed by the inverters 602, 604 to be released by whichever of these signals arrives first. Thus the detector 214 has low susceptibility to mismatch induced by process variations.

Figure 7:
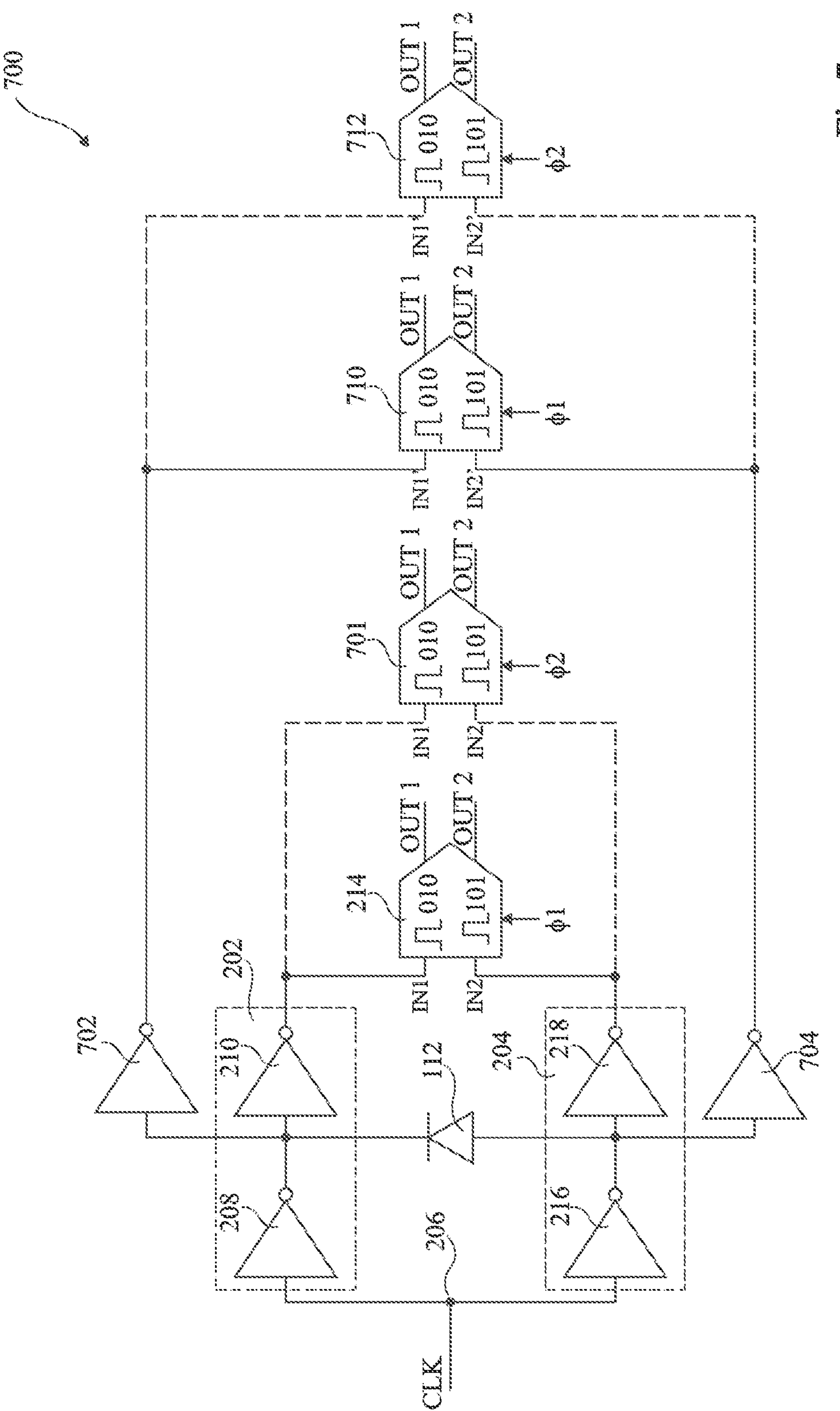
FIG. 7 schematically illustrates an optical receiver for receiving an optical data signal according to a further example embodiment of the present disclosure.

FIG. 7 schematically illustrates an optical receiver 700 according to a further example embodiment according to which it is adapted to operate at double date rate by receiving signals on both rising and falling edges of the clock signal. Certain features of the optical receiver 700 of FIG. 7 are the same as features of FIGS. 2 and 3, and these features have been labelled with like reference numerals and will not be described again in detail.

The optical receiver 700 for example comprises only the inverters 208 and 210 in the branch 202, and the inverters 216 and 218 in the branch 204. In the illustrated example, the photodiode 112 is coupled between the nodes 222 and 226 like in the embodiment of FIG. 3, although in alternative embodiments it could be coupled in a different manner. The outputs of the inverters 210 and 218 for example provide the modified timing signals IN1, IN2 to the early-late detector 214.

In some embodiments, a further early-late detector 701 is provided coupled to the outputs of the inverters 210, 218. Both detectors 214 and 701 are for example implemented by the circuit of FIG. 6, although they are for example adapted to detect the phase of rising edges of the signals IN1, IN2, and thus the inverters 614 and 616 are for example omitted. The switch 613 of the early-late detector 214 is for example controlled by a phase signal $\phi$1, and the switch 613 of the early-late detector 701 is controlled by a phase signal $\phi$2, the phase signals $\phi 1$ and $\phi 2$ being high during alternating periods such that the detectors 214 and 701 operate in a time-interleaved fashion on alternate rising edges of the signals IN1, IN2.

A further branch is for example formed by a logic gate 702 having its input coupled to the output of the inverter 208 of the branch 202, and yet a further branch is for example formed by a logic gate 704 having its input coupled to the output of the inverter 216 of the branch 204. The logic gates 702 and 704 are for example inverters. The output of gate 702 provides a modified timing signal IN1', and is coupled to one input of a further relative phase detector 710, which is for example implemented by the early-late detector of FIG. 6. The output of gate 704 provides a modified timing signal IN2', and is coupled to the other input of the relative phase detector 710. The detector 710 for example detects the phase difference between the falling edges of the signals IN1' and IN2'.

In some embodiments, yet a further relative phase detector 712 is provided coupled to the outputs of the inverters 702 and 704. The relative phase detector 710 is for example controlled by the phase signal $\phi 1$, whereas the relative phase detector 712 is for example controlled by the phase signal $\phi 2$, such that these relative phase detectors operate in a time-interleaved manner in a similar fashion to the relative phase detectors 214 and 701.

The inverters 210 and 218 are for example adapted to have a threshold level higher than the mid-voltage between their high and low supply voltages, such that the phase difference induced by the photodiode 112 on rising edges is amplified. The inverters 702 and 704 are for example adapted to have a threshold level lower than the mid-voltage between their high and low supply voltages, such that the phase difference induced by the photodiode 112 on falling edges is amplified.

An advantage of the embodiments described herein is that the optical receiver has a high sensitivity and relatively low power consumption. Furthermore, the early-late detector as described herein in relation to FIG. 6 provides the advantage of having a particularly high speed of operating, for example permitting the sign of the phase difference to be detected for phases differences of 2 ps or less between the modified timing signals IN1, IN2.

Having thus described at least one illustrative embodiment, various alterations, modifications and improvements will readily occur to those skilled in the art. For example, it will be apparent to those skilled in the art that embodiments have been described based on MOS transistors, alternative embodiments could at least partially be based on other transistor technologies such as bipolar technology.

Furthermore, it will be apparent to those skilled in the art how the positive supply rail and ground rail in the various embodiments could be exchanged with each other, and that rather than a ground voltage, a different supply voltage level could be used, such as a negative voltage.

Furthermore, it will be apparent to those skilled in the art that the various features described in relation to the various embodiments could be combined, in alternative embodiments, in any combination.

The invention claimed is:

1. An optical receiver adapted to convert a received optical signal into a phase change of a timing signal to generate a first modified timing signal and to generate a data signal by comparing the first modified timing signal with a reference signal, comprising:

- an input adapted to receive the timing signal having rising and falling edges;
- a first branch coupled to the input and comprising at least one logic gate adapted to propagate the timing signal and to generate the first modified timing signal;
- a second branch coupled to the input and comprising at least one logic gate adapted to propagate the timing signal and to generate a second modified timing signal forming said reference signal;
- a photodiode adapted to convert the received optical signal into a current signal, the photodiode being coupled to at least one of the first and second branches to induce, based on the current signal, a phase difference between rising or falling edges of the first and second modified timing signals; and
- a relative phase detector adapted generate the data signal by detecting the relative phases of rising or falling edges of the first and second modified timing signals.

2. The optical receiver of claim 1, wherein the photodiode is coupled so that the current signal causes a change in the slope of a first rising or falling edge of the timing signal propagating through at least one of the first and second branches, at least one of the first and second branches comprising a comparator adapted to convert the change of slope into a phase shift of the first rising or falling edge.

3. The optical receiver of claim 2, wherein the rising or falling edge is a voltage transition between first and second voltage levels, and wherein the comparator is a transistor device adapted to generate a voltage transition at its output when the voltage at its input crosses a threshold level, wherein the comparator is adapted such that the threshold level is at least 10 percent higher or lower than a mid-point between the first and second voltage levels.

4. The optical receiver of claim 1, wherein the first branch comprises a first logic gate connected to the input and the photodiode is coupled to an output of the first logic gate.

5. The optical receiver of claim 4, wherein the second branch comprises a second logic gate connected to the input, and wherein the photodiode is coupled between the output of the first logic gate and an output of the second logic gate.

6. The optical receiver of claim 1, wherein the first branch comprises a second logic gate having an input node coupled to the input and having a first supply voltage input node coupled to a first supply voltage rail via a first current source, wherein the photodiode is coupled to the first supply voltage input node.

7. The optical receiver of claim 6, wherein the second branch comprises a second logic gate having an input node coupled to the input and having a first supply voltage input node coupled to the first supply voltage rail via a second current source, wherein the photodiode is coupled between the first supply voltage input nodes of the second logic gates of the first and second branches.

8. The optical receiver of claim 1, wherein the photodiode is coupled between the first and second branches.

9. The optical receiver of claim 1, wherein the relative phase detector is adapted to detect the relative phases of rising edges of the first and second modified timing signals, the optical receiver further comprising:

- a third branch coupled to the input and comprising at least one logic gate adapted to propagate the timing signal and generate a third modified timing signal;
- a fourth branch coupled to the input and comprising at least one logic gate adapted to propagate the timing signal and generate a fourth modified timing signal; and
- a further relative phase detector adapted to generate a further data signal by detecting the relative phases of falling edges of the third and fourth modified timing signals.

10. The optical receiver of claim 9, wherein the photodiode is coupled so that the current signal causes a change in the slope of a first rising edge of the timing signal propagating through at least one of the first and second branches, and of a first falling edge of the timing signal propagating through at least one of the third and fourth branches, and wherein the first and second branches each comprise a first comparator adapted to generate a voltage transition at its output when the voltage at its input crosses a threshold level, wherein the first comparators are adapted such that the threshold level is at least 10 percent higher than a mid-point between the first and second voltage levels, and wherein the third and fourth branches each comprise a second comparator adapted to generate a voltage transition at its output when the voltage at its input crosses a threshold level, wherein the second comparators are adapted such that the threshold level is at least 10 percent lower than a mid-point between the first and second voltage levels.

11. The optical receiver of claim 10, wherein the first and second comparators are formed by inverters.

12. The optical receiver of claim 1, wherein the relative phase detector comprises an early-late detector comprising:

a bi-stable storage device formed of a pair of inverters cross-coupled between first and second output nodes of the early-late detector;

at least one first switch coupled between the first and second output nodes and controlled based on the first and second modified timing signals;

a second switch controlled based on the first modified timing signal and coupled between the first node and a first supply voltage rail; and a third switch controlled based on the second modified timing signal and coupled between the second node and the first supply voltage rail.

13. The optical receiver of claim 12, wherein the at least one first switch comprises a pair of first switches coupled in series between the first and second output nodes, a first switch of the pair being controlled based on the first modified timing signal, and a second switch of the pair being controlled based on the second modified timing signal.

14. The optical receiver of claim 13, wherein the at least one first switch further comprises a further switch coupled between the switches of the pair of first switches and controlled by an activation signal to selectively activate the relative phase detector.

15. The optical receiver of claim 1, wherein the optical signal represents a first data signal and the data signal generated by the relative phase detector is a reconstruction of the first data signal.

* * * * *